United States Patent [19]

Donaher et al.

[11] E Patent Number: Re. 31,929

[45] Reissued Date of Patent: Jun. 25, 1985

[54] ELECTRONIC PACKAGE AND ACCESSORY COMPONENT ASSEMBLY

[75] Inventors: Charles J. Donaher, Los Altos Hills; Gordon D. Christensen, San Jose, both of Calif.

[73] Assignee: Thomas & Betts Corporation, Raritan, N.J.

[21] Appl. No.: 499,095

[22] Filed: May 27, 1983

Related U.S. Patent Documents

Reissue of:

[64] Patent No.: 4,356,532
Issued: Oct. 26, 1982
Appl. No.: 170,014
Filed: Jul. 18, 1980

[51] Int. Cl.[3] ..... H05K 7/20

[52] U.S. Cl. ..... 361/393; 339/17 CF; 174/52 FP; 361/396; 361/329

[58] Field of Search ..... 174/52 FP; 339/17 R, 339/17 C, 17 CF; 357/51, 74; 361/380, 392-396, 400, 401, 403, 405, 412, 417, 419, 420, 429, 301, 306, 308, 309, 328-330, 425, 426, 399

[56] References Cited

U.S. PATENT DOCUMENTS

| | | | |
|---|---|---|---|
| 3,522,485 | 8/1970 | De Metrick | 361/399 |
| 3,681,665 | 8/1972 | Olds | 361/400 |
| 3,880,493 | 4/1975 | Lockhart, Jr. | 339/147 |
| 3,912,984 | 10/1975 | Lockhart, Jr. | 339/147 |
| 3,951,495 | 4/1976 | Donaher | 339/17 CF |
| 3,999,826 | 12/1976 | Yurtin | 339/17 F |
| 4,012,117 | 3/1977 | Lazzery | 339/176 MP |
| 4,018,494 | 4/1977 | Scheingold | 339/17 CF |
| 4,045,105 | 8/1977 | Lee | 339/17 CF |
| 4,080,026 | 3/1978 | Gianni | 339/17 CF |
| 4,116,519 | 9/1978 | Grabbe | 339/17 CF |
| 4,137,559 | 1/1979 | Reuting | 361/393 |
| 4,143,508 | 3/1979 | Ohno | 361/401 |
| 4,226,491 | 10/1980 | Kazama | 361/399 |
| 4,249,196 | 2/1981 | Durney | 357/74 |
| 4,281,359 | 7/1981 | Bayer | 361/393 |
| 4,396,532 | 10/1982 | Donaher | 361/393 |

FOREIGN PATENT DOCUMENTS

| | | | |
|---|---|---|---|
| 680949 | 2/1964 | Canada | 250/16.01 |
| 747010 | 11/1966 | Canada | 250/16.01 |
| 811889 | 4/1969 | Canada | 356/17 |
| 1188520 | 4/1970 | United Kingdom | 339/17 |

*Primary Examiner*—G. P. Tolin
*Attorney, Agent, or Firm*—Robert M. Rodrick; Salvatore J. Abbruzzese

[57] ABSTRACT

Common printed circuit board area usage is provided for electronic packages and accessory components by the provision of an assembly including a receptacle stacking a package and accessory component and having electrical contact elements with fixed portions selectively connected to component contacts and other portions for engaging package contacts. In a preferred embodiment, the assembly includes one or more dual-in-line packages (DIP) and the accessory component is a capacitive decoupling assembly.

10 Claims, 20 Drawing Figures

ELECTRONIC PACKAGE AND ACCESSORY COMPONENT ASSEMBLY

Matter enclosed in heavy brackets [ ] appears in the original patent but forms no part of this reissue specification; matter printed in italics indicates the additions made by reissue.

FIELD OF THE INVENTION

This invention relates generally to electrical assemblies and pertains more particularly to assemblies for interconnecting electronic packages and components with support substrates.

BACKGROUND OF THE INVENTION

In recent years, the electronics industry has looked increasingly to so-called "stacking" of chip carriers and the like to meet information density requirements. Such practice, wherein plural packages overlie common printed circuit board (PCB) real estate, provides a doubling or more of information density, for example, memory capability.

Known efforts in this area, preceding that set forth in copending commonly-assigned application Ser. No. 85,767 filed on Oct. 17, 1979, had looked to the stacking of chip carriers and dual-in-line packages (DIP) and had provided receptacles having contacts insertable in PCB apertures for soldering thereto and extending upwardly from the PCB to frictionally receive and engage contacts of packages inserted into the receptacles.

Where it was desired to employ the stacked packages electrically independently of one another, the art preceding the '767 application had looked to several measures for separately addressing the packages. Typically, the contacts of the stacked packages were vertically aligned and circuit paths to the PCB would be redundant to the stacked packages for contacts thereof not involved in package selection. Thus, a single receptacle contact would engage vertically successive package contacts. On the other hand, a unique circuit path is required from the PCB to each package contact providing selection or activation of a package. In one known prior approach, receptacle contacts were provided with break-away portions, whereby one would interrupt continuity from the PCB to an upper package contact or a lower package contact, despite vertical alignment thereof. In another known prior approach, package selection contacts were led from the receptacle off-board and were thus not available at the PCB as were all other package contacts. In still another prior approach, packages were customized to provide for vertically unaligned select/address contacts.

While stacking presents little user difficulty where the stacked packages are used electrically dependently in parallel circuit relation to the PCB, user difficulty is seen in the alternative situation wherein vertical address/select differentiation is required. In the first known prior approach discussed above, bypassing of one of two vertically aligned package contacts presented a problem in later accessing such bypassed contact from the PCB. Thus, one needed to define another usable circuit path, for example, from the bypassed package contact to an unused package contact and thence to the PCB through a receptacle contact servicing the unused package contact. In the second discussed prior approach, the off-board disposition of address/select package contacts precluded accessing from the PCB. The last noted prior approach required the tailoring of package contact layout to the receptacle contacts and accordingly did not lend itself to standardization permitting commercial package substitution. Finally, all of the known approaches prior to the '767 application adopted frictional contact interfitting and did not meet zer insertion force applications.

The above and related approaches are more specifically identified in the statement filed herein pursuant to 37 CFR 1.97 and 1.98.

In the '767 application, applicants herein set forth a receptacle for supporting electronic packages in stacked relation and providing electrical connection to package contacts without the disadvantages of the prior approaches. Such receptacle has an upstanding housing defining a channel and supports received packages in vertically spaced relation in the channel. Contacts are supported in the housing in vertically spaced relation and in noninterfering disposition with respect to the channel. An actuator is supported in the housing for displacing the contacts from such noninterfering disposition with respect to the channel into engagement with contacts of the packages. As is set forth in more detail below, the '767 receptacle includes movable support means for the upper stacked package and provides selective spacings of contact sets to facilitate accessing of the packages.

The objective of using common PCB real estate for plural packages, as noted above, is reached by the '767 receptacle with zero insertion force and other benefit. The present invention addresses a further enhancement in PCB real estate usage, namely, disposition of electronic components which are accessory to electronic packages stacked in receptacles. As an example of such an accessory component, a decoupling capacitor typically is used for each separate voltage level supplied to a DIP. Presently, such capacitors are disposed on PCBs as sole consumers of PCB real estate, adjacent the DIP which they serve and are connected to PCB strips in turn electrically connected to package receptacle contacts.

SUMMARY OF THE INVENTION

It is an object of this invention to provide for enhanced PCB real estate usage.

A more particular object of the invention is to provide for common PCB real estate usage for electronic packages and components accessory thereto.

A still more specific object of the invention is to provide assemblies interconnecting one or more electronic packages to PCB and like support substates and having capacitive decoupling capability.

In attaining the foregoing and other objects, the invention provides an assembly having a receptacle commonly housing both an electronic package and a component accessory thereto, both electrically connected to a common electrical contact extending from the receptacle. In its preferred embodiment, the invention is shown in usage of the '767 receptacle, expanding same to provide integrally housed capacitive decoupling means.

DESCRIPTION OF THE PREFERRED EMBODIMENT

Figure 1:
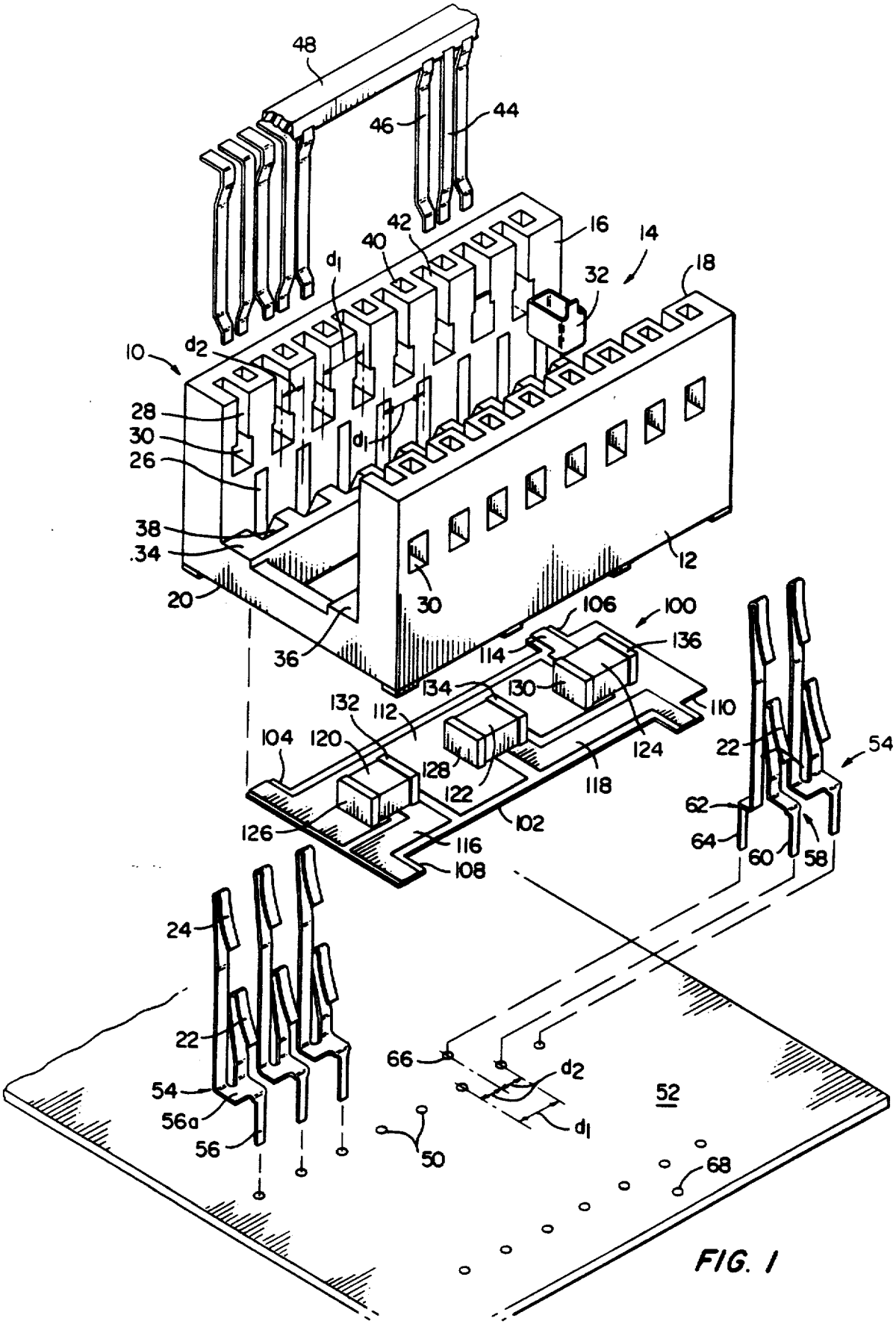
FIG. 1 is an exploded perspective view of an interconnect assembly in accordance with the present application shown above a PCB for use with the assembly.
Figure 2A:
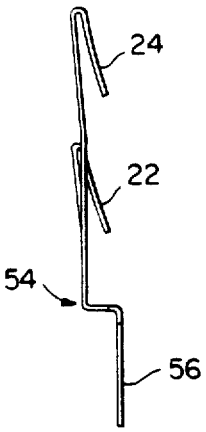
FIGS. 2(a)–2(f) are side and front elevations of diverse receptacle contact configurations for the FIG. 1 receptacle.
Figure 2B:
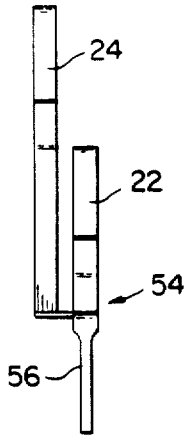
Figure 2C:
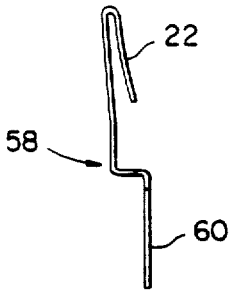
Figure 2D:
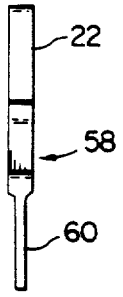
Figure 2E:
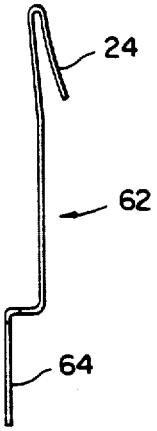
Figure 2F:
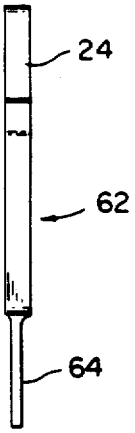

Referring to FIG. 1, interconnect receptacle 10 includes housing 12 having elongate channel 14 extending between open ends of the housing and bordered by housing interior sidewalls 16 and 18. The channel is of top-open type to facilitate vertical insertion of electronic packages or components to be stacked within housing 12. Openings are formed in bottom surface 20 of housing 12 for insertion of contacts 22 and 24 respectively into registry with lower contact slots 26 and upper contact slots 28. For purposes discussed in detail below, each upper contact slot has an expanded portion 30 for receiving upper component support insert 32. Lower component support is provided by interior base surfaces 34 and 36. Chamfered guides 38 lead from surfaces 34 and 36 into lower contact slots 26 to guide leads of the lower electronic component into registry with lower contacts 22.

Housing top surface openings 40 and 42 are continuous respectively with lower contact slots 26 and upper contact slots 28. Actuators 44 (lower contact) and 46 (upper contact) are supported in common by plate 48 for respective entry into openings 40 and 42 and vertical movement in slots 26 and 28.

Upper contact slots 28 are uniformly spaced on centers by distance $d_1$ longitudinally along channel 14. Like spacing $d_1$ is provided between centers of lower contact slots 26. A longitudinal offset distance $d_2$ exists between respective centers of each lower slot 26 and each adjacent upper slot 28, spacing $d_2$ being one-half of spacing $d_1$. With spacing $d_1$ also applying between adjacent apertures 50 of printed circuit board 52, the FIG. 1 arrangement provides vertical nonalignment of upper and lower receptacle contacts, while permitting access to both such contacts between successive PCB apertures. To this end, contact configuration 54 supports lower contact 22 jointly with upper contact 24 with center spacing $d_2$ and stem 56 provides PCB connection for both contacts. Contact configuration 58 supports only a lower contact 22 and stem 60 provides PCB connection therefor. Contact configuration 62 differs by supporting only an upper contact 24 and has its stem 64 offset to the opposite side of the contact, all such contact configurations being illustrated in FIGS. 2(a-)–2(f) in detail showing these similarities and differences.

Contact configuration 54 is used throughout for collectively bringing to the PCB those package contacts not involved in address/select function. Contact configuration 58 is used to access the lower component received in receptacle 10 and contact configuration 62 is used to access the upper component received in receptacle 10. PCB 52 is complemental to receptacle 10, and vice versa, with quite slight departure from customary PCB geometry for receiving a single DIP. Thus, board apertures 50 may run in two parallel rows with uniform spacing. An additional aperture 66 is formed in the PCB, at longitudinal spacing $d_2$ from adjacent apertures 50, for upper component accessing. In instances where one may look to stacking dynamic components, e.g., where read/write access strokes are needed for each package, a further aperture 68 may be formed outboard of apertures 50 and longitudinally staggered with respect thereto, as in the case of aperture 66. As will be seen, all of apertures 50, 66 and 68 are inboard of the perimeter of receptacle 10 when the PCB and receptacle are assembled.

Capacitive decoupling assembly 100 is adapted for integral containment by receptacle 10 and includes board or substrate 102 having projecting ears 104, 106, 108 and 110, electrically conductive strips 112, 114, 116 and 118 and capacitors 120, 122 and 124. The capacitors have first terminals 126, 128 and 130 and second terminals 132, 134 and 136. As indicated, conductive strip 112 is in registry with each of capacitor first terminals 126, 128 and 130. Strips 114, 116 and 118 are in separate registry with capacitor second terminals 136, 132 and 134. In this exemplary accessory component showing, it is assumed that three diverse d.c. voltage levels are supplied to the packages in the receptacle, to be decoupled individually by the three capacitors. As will be shown below (FIG. 13), board 102 will be disposed flush with bottom surface 20 of housing 12, with the capacitors received in openings in surface 20 and recesses in housing 12.

Figure 7:
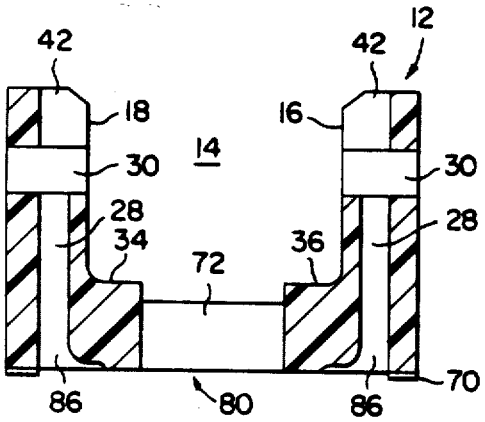
FIG. 7 is a sectional view as seen from plane VII—VII of FIG. 5.
Figure 8:
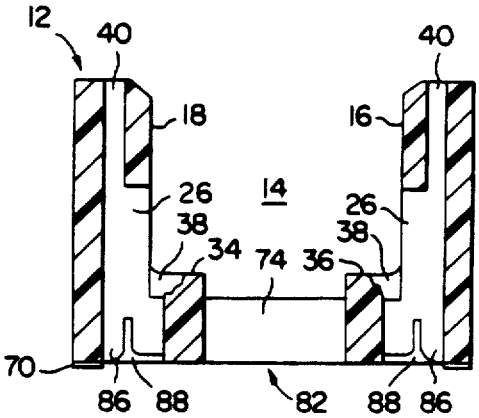
FIG. 8 is a sectional view as seen from plane VIII—VIII of FIG. 5.

Housing interior structural detail is seen in FIGS. 4–8. The housing is upstanding from feet 70 and has transverse base ribs 72–78 extending between interior sidewalls 16 and 18, openings/recesses 80–84 existing between the ribs for receipt of accessory components therein, e.g., capacitors 120–124. FIG. 7 shows housing 12 sectionally through upper contact slots 28 and illustrates openings 86 for insertion of contacts. FIG. 8 shows housing 12 sectionally through lower contact slots 26. Openings 86 of FIG. 7 are also seen in FIG. 8, as such openings bridge slots 26 and 28 whereby a contact of configuration 54 of FIG. 2(a) may be inserted with its contacts 22 and 24 seating in slots 26 and 28. Openings 86 likewise permit insertion of contacts of configuration 58 of FIG. 2(c) in slots 26 and contacts of configuration 62 of FIG. 2(3) in slots 28. Contact retainers 88 (FIG. 8) removably secure the contacts in housing 12, the contacts being provided with locking tangs (not shown) for frictional engagement with the retainers and interior housing structure.

Figure 3A:
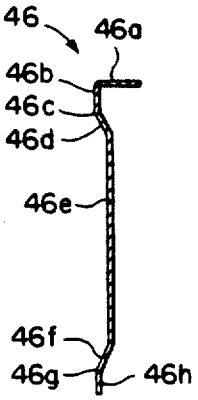
FIGS. 3(a)–3(c) are side and front elevations of contact actuators of the FIG. 1 receptacle.
Figure 3B:
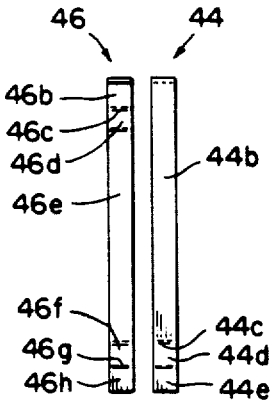
Figure 3C:
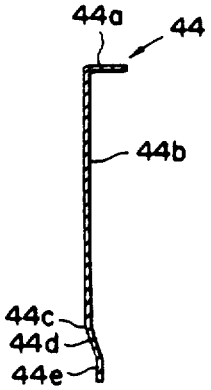
Figure 5:
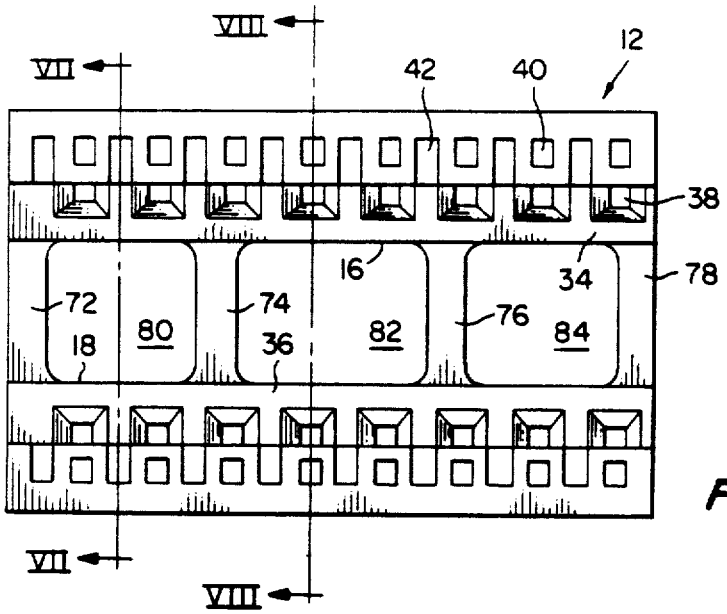
FIG. 5 is a top plan view of the FIG. 4 housing.
Figure 4:
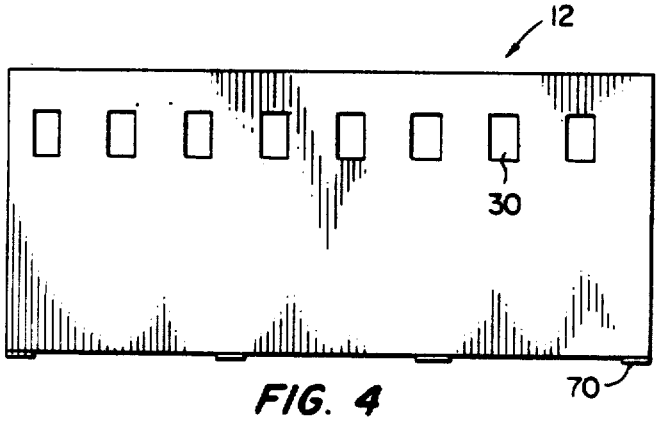
FIG. 4 is a front elevation of the housing of the FIG. 1 receptacle.
Figure 6:
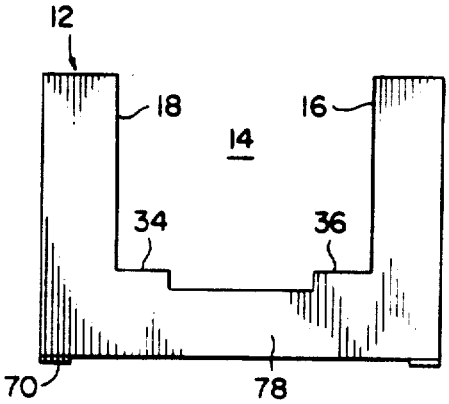
FIG. 6 is a side elevation of the FIG. 4 housing.

Referring to FIGS. 3(a)–3(c), lower contact actuator 44 has a horizontal flange 44a for securement to plate 48 of FIG. 1, a vertical run 44b, a knee 44c, an inclined run 44d and a further vertical run 44e in spaced parallel relation to run 44b. Upper contact actuator 46 has a horizontal flange 46a, a first vertical run 46b, an upper knee 46c, an upper inclined run 46d, a second vertical run 46e, a lower inclined run 46f, a lower knee 46g and a third vertical run 46h. The operation of the actuators upon respective lower and upper contacts will now be discussed in conjunction with FIGS. 9–12.

Figure 10:
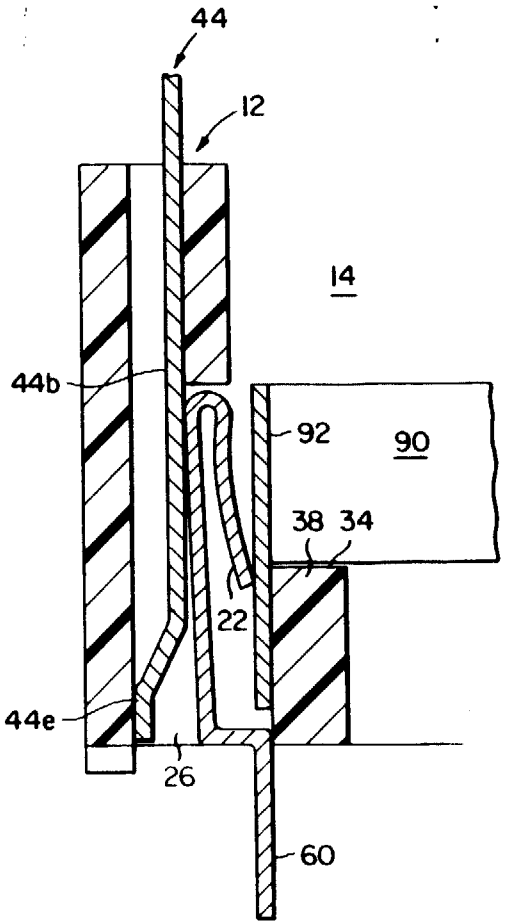
FIGS. 9 and 10 are sectional views illustrating actuator-contact relations for the lower contacts of the FIG. 1 receptacle and omitting capactive decoupling assembly 100 of FIG. 1.
Figure 9:
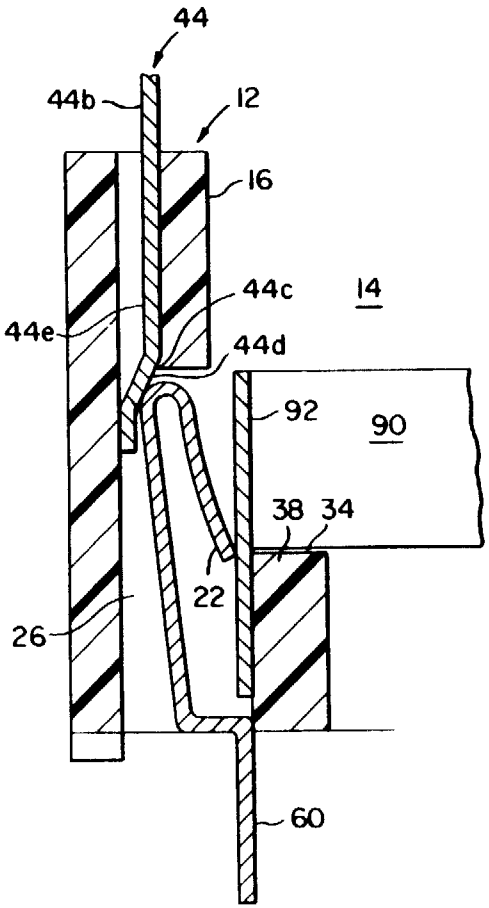

In FIG. 9, lower component package 90 is shown inserted in channel 14 of housing 12 with package contact 92, in dependent leg form as for a DIP, seated in guide 38. Vertical positioning and support for the package is established by support surface 34. In the course of package insertion, actuator 44 is moved vertically upward of its FIG. 9 position, i.e., above and out of engagement with contact 22, whereby the contact is self-biased leftwardly of its FIG. 9 position and insertion of package contact 92 is attained with zero insertion force. In the position of actuator 44 in FIG. 9, following package insertion, contact 22 is forced, by engagement with actuator inclined run 44d, into electrical engagement with package contact 92. In FIG. 10, actuator 44 is in fully inserted position, as will be the case (discussed below) when an upper component package is electrically engaged in the housing and all actuators are fully inserted in the housing. In this FIG. 10 actuator position, contact 22 is engaged by actuator vertical run 44b which is forced rightwardly in slot 26 by reason of housing restraint on spaced vertical run 44e. The inserted extent of package contact 92 is captured against housing extent below surface 34 and guide 38 by contact 22 pressure thereon.

Following insertion of lower component package 90 into housing 12, support inserts 32 (FIG. 11) are to be displaced outwardly of expanded portions 30 of upper contact slots 28 to provide vertical positioning and support for upper component package 94. This may be done, prior to insertion of package 94, by downward movement of actuator 46 from its position shown in FIG. 11. Such movement forces actuator inclined run 46d into slot 28, urging contact 24 leftwardly against wall 32a of insert 32 and displacing the insert outwardly. Insert wall 32b bears against actuator vertical run 46e to precisely measure insert displacement into such position as to underlie package 94 and sit leftwardly of package contact 96 on package insertion. Actuator 46 is now elevated to slightly above its FIG. 11 position whereby contact 24 returns, under self-bias, to noninterfering relation to the zero force insertion path of package contact 96. On package 94 insertion, actuator 46 is moved downwardly through its FIG. 11 position, whereupon contact 24 electrically engages package contact 96, and into its FIG. 12 position. In such fully inserted position, actuator vertical runs 46h bears against the base of contact 24 and its vertical run 46e bears against the rightward slot wall. This disposes actuator knee 46c against contact 24, compressing same against package contact 96.

Referring again to FIG. 1, in assembling receptacle 10, inserts 32 are first placed in expanded portions 30 of upper contact slots 28. Contacts are next inserted through the receptacle bottom surface and inserts 32, contact configuration being preselected in the three diverse varieties in accordance with the nature of the component packages to be received and PCB connections desired. On insertion of the actuators, the receptacle is readied for package insertion.

Figure 11:
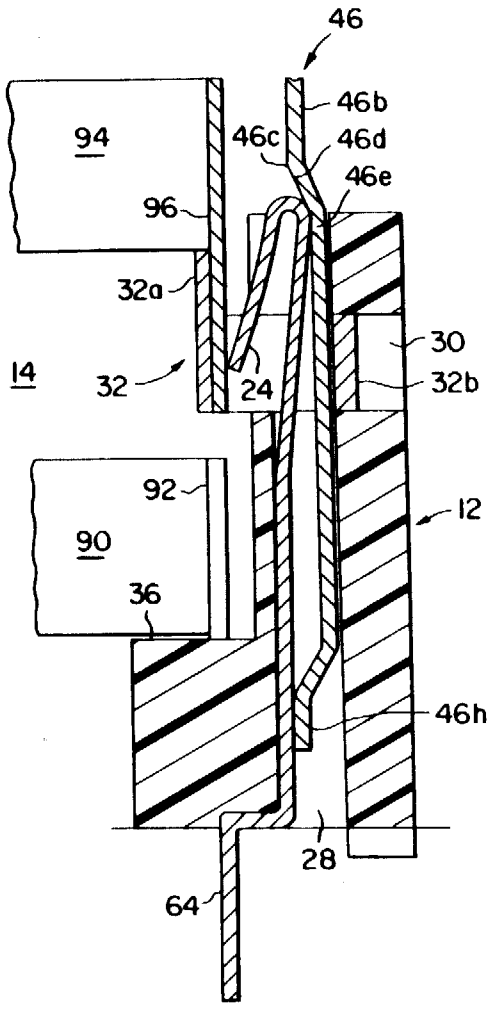
FIGS. 11 and 12 are sectional views illustrating actuator-contact relations for the upper contacts of the FIG. 1 receptacle for convenience.
Figure 12:
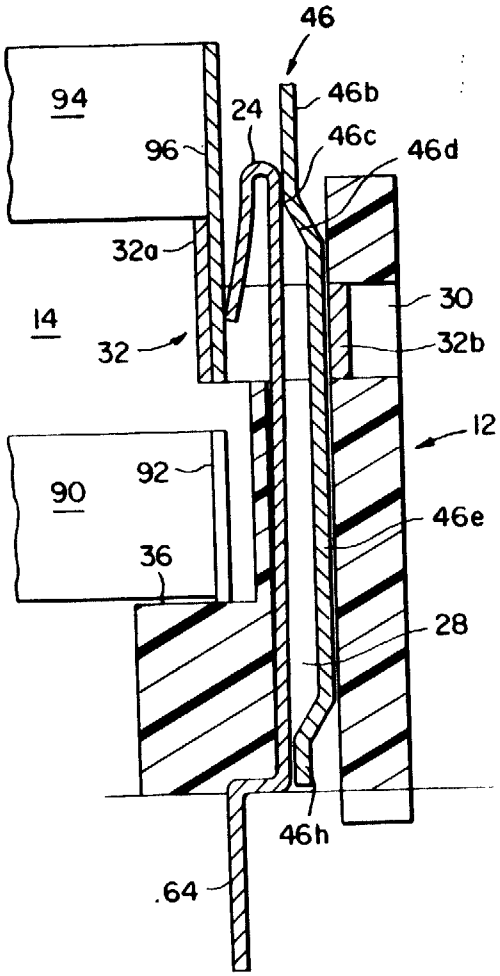

Based on the difference in configurations of actuators 44 and 46, upper package removal and substitution may be made at any time without interrupting electrical continuity between the lower package and the PCB. As depicted in FIGS. 11 and 12, vertical spacing is prescribed as between inserted packages 90 and 94, channel 14 remaining fully open in such interpackage volume. Connection to PCB is readily made without packages inserted, thus isolating the packages from soldering heat and the like. As noted above, desired zero insertion force is afforded by selective actuator positioning.

The receptacle housing is preferably comprised of molded plastic. The actuators and upper package support inserts may also be of rigid synthetic matter, but are preferably metal. Contacts may be noble metal-plated, based on zero insertion force.

Figure 13:
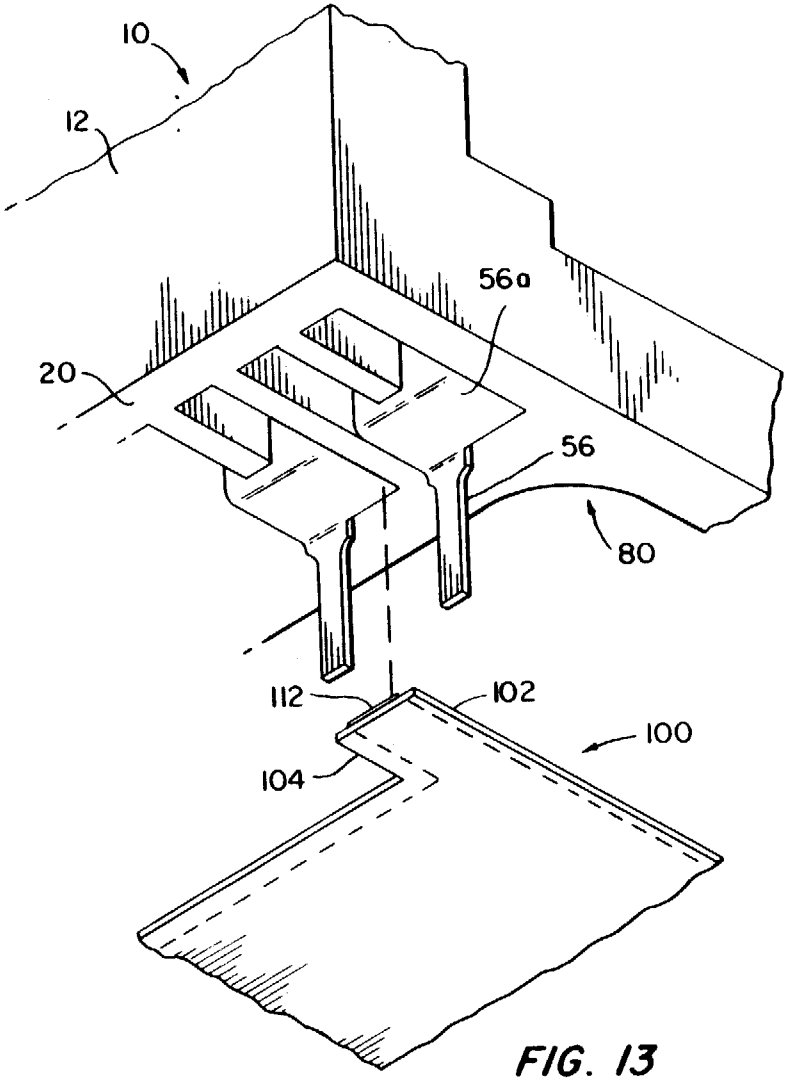
FIG. 13 is an exploded view showing the positional registration of receptacle contacts and a PCB strip of capacitive decoupling assembly 100 of FIG. 1.

Reference is now made to FIG. 13 to complete discussion of the exemplary assembly herein. Capacitive decoupling assembly 100 is shown in exploded fashion with receptacle 10, set downwardly therebelow to show the intended registry of ear 104 of board 102 with receptacle end contact 54. As will be seen, as board 102 is elevated into flush relationship with bottom surface 20 of housing 12, contact land 56a and strip 112 are placed in registry, to be electrically interconnected, as by soldering or the like. In this arrangement, as seen by reference again to FIG. 1, such end contact 56 is connected in common, through strip 112, to ground terminals 126, 128 and 130 of capacitors 120, 122 and 124. Ears 106, 108 and 110 of FIG. 1 are similarly disposed in registry with other receptacle contacts and strips 114, 116 and 118 are electrically connected thereto whereby capacitors 120, 122 and 124 are connected individually between ground and such other receptacle contacts to effect capacitive decoupling of d.c. voltages applied from the PCB to such other receptacle contacts.

While the described assembly embodiment is inclusive of plural electronic packages, a single received package may of course be assembled with zero insertion force in a single level receptacle also having an integrally packaged accessory component. In this connection, receptacle 10 above will be seen as fixedly supporting a first portion of contacts 56, i.e., lands 56a, for selective connection to the accessory component. The remainder of contacts 56 may be considered as second portions vertically spaced from such first portions and are supported by the receptacle for electrical engagement with the package contacts. As will also be seen, the assembly is highly ventilated as the receptacle ends and top are fully and airflow between packages and accessory components is permitted by the spacings provided therebetween.

Various modifications to the foregoing particularly set forth embodiment of the invention will now be evident to those skilled in the art. Accordingly, such preferred embodiment and the foregoing discussion thereof are intended in an illustrative and not in a limiting sense. The true spirit and scope of the invention is set forth in the following claims.

What is claimed is:

1. An electronic assembly comprising:

an electronic package having electrical contacts;

accessory component means for said package having electrical contacts for connection with said package contacts, said component means including a substrate and a component supported by said substrate, said substrate defining said component means contacts;

receptacle means having an upstanding housing defining a top opening removably receiving said package, a bottom opening removably receiving said component [means] and a channel extending between such top and bottom openings providing for residence of said package and said component [means] in vertically spaced relation in said receptacle means, said substrate being juxtaposed with a housing surface adjacent said bottom opening;

a plurality of contact elements having first portions fixedly supported in said housing, said first portions extending through said bottom opening and exteriorly thereof for engagement externally of said assembly and second portions vertically spaced from said first portions and electrically engaging said package contacts;

said substrate further including ear portions extending horizontally outwardly thereof, said contact element first portions including horizontally extending lands adjacent said housing surface, said substrate ear portions and said lands being electrically connected adjacent said housing surface.

2. The assembly claimed in claim 1 wherein said substrate includes electrically conductive strips constituting said component means contacts and connected to said component.

3. The assembly claimed in claim 1 wherein said contact elements further include stem portions extending downwardly of said lands for electrical connection of said package and said component means to a printed circuit board.

4. The assembly claimed in claim 1 wherein said component means is a capacitive decoupling means.

5. The assembly claimed in claim 4 wherein said capacitive decoupling means includes at least one capacitor having a body and terminals disposed in said housing in vertically spaced relation to said electronic package.

6. The assembly claimed in claim 5 wherein said capacitive decoupling means further includes said substrate bearing electrically conductive strips connected separately to said capacitor terminals and constituting said component means contacts.

7. The assembly as claimed in claim 4 wherein said capacitive coupling means includes plural capacitors, each for providing capacitive decoupling for an individual one of plural supply voltages required by said package.

*8. In an electrical assembly of the type including an electrical package having a row of contacts, accessory component means in electrical interconnection with said package contacts, comprising:*

*a substrate of insulative material, a plurality of spaced conductive strips on said substrate and an electrical component supported by said substrate and electrically connected to selected conductive strips; and*

*plural ear portions, each including a portion of one of said selected conductive strips, projecting outwardly from one side edge of said substrate at spaced locations and defining therebetween an open region within which reside contacts of said package that are not connected to said component means, said ear portions being electrically connected to selected contacts in said row that are not adjacent to each other.*

*9. The invention claimed in claim 8 wherein said substrate includes spaced portions projecting outwardly from said one side edge thereof, each corresponding in location with and supporting a respective portion of said selected conductive strips.*

*10. The invention claimed in claim 8 further including plural ear portions projecting outwardly from another side edge of said substrate opposite said one side edge, said further plural ear portions each including a portion of others of said plurality of conductive strips on said substrate, said further ear portions being electrically connected to other selected contacts of said package that extend in another row spaced from and parallel to said row of contacts.*

* * * * *